(12) United States Patent
Tsai et al.

(10) Patent No.: US 8,767,198 B2
(45) Date of Patent: Jul. 1, 2014

(54) DETECTION APPARATUS (71) Applicant: Genesis Photonics Inc, Tainan (TW)

(72) Inventors: Tai-Cheng Tsai, Tainan (TW); Tai-Wei Wu, Tainan (TW); Gwo-Jiun Sheu, Tainan (TW); Shou-Wen Hsu, Tainan (TW); Yun-Li Li, Tainan (TW)

(73) Assignee: Genesis Photonics Inc, Tainan (TW)

( * ) Notice: Subject to any disclaimer, the term of this patent is extended or adjusted under 35 U.S.C. 154(b) by 0 days.

(21) Appl. No.: 13/838,824

(22) Filed: Mar. 15, 2013

(65) Prior Publication Data
US 2014/0084191 A1    Mar. 27, 2014

(30) Foreign Application Priority Data

Sep. 27, 2012 (TW) .............................. 101135674 A (51) Int. Cl.
*G01J 1/00* (2006.01)
*G01J 1/42* (2006.01)
*G01J 1/04* (2006.01)

(52) U.S. Cl.
CPC .... *G01J 1/42* (2013.01); *G01J 1/04* (2013.01); *G01J 1/4257* (2013.01)
USPC .......................................... 356/213; 356/218

(58) Field of Classification Search
CPC . G01J 1/4257; G02B 23/2469; G02B 6/0006; G02B 6/0008; G02B 6/04; G02B 6/241; G02B 6/2808; G02B 6/40; G02B 6/403; G02B 6/4202; G02B 6/4206; G02B 6/4212; G02B 6/4214; G02B 6/4248; G02B 6/4249; G02B 6/429

USPC .................................................. 356/213–222
See application file for complete search history.

(56) References Cited

U.S. PATENT DOCUMENTS

| | | | |
|---|---|---|---|
| 7,064,832 B2* | 6/2006 | Rogers | 356/406 |
| 7,804,589 B2* | 9/2010 | Tseng et al. | 356/213 |
| 2010/0246936 A1* | 9/2010 | Ji et al. | 382/149 |
| 2011/0053295 A1* | 3/2011 | Yoon et al. | 438/15 |
| 2012/0122250 A1* | 5/2012 | Ji et al. | 438/15 |
| 2013/0015859 A1* | 1/2013 | Tseng et al. | 324/414 |
| 2013/0301050 A1* | 11/2013 | Tseng | 356/402 |

FOREIGN PATENT DOCUMENTS

EP    2439517 A1 *    4/2012

* cited by examiner

*Primary Examiner* — Michael P Stafira
(74) *Attorney, Agent, or Firm* — Muncy, Geissler, Olds & Lowe, P.C.

(57) ABSTRACT

A detection apparatus comprising a chuck, a probe device, a light-sensing device and a light-concentrating unit is disclosed. The chuck bears light-emitting diode chips. The probe device includes two probes and a power supply. The end point of the probes respectively electrically connects with one of the light-emitting diode chips and the power supply to make the light-emitting diode chip emits a plurality of light beams. The light-sensing device is disposed on one side of a light-emitting surface of the light-emitting diode chip so as to receive the light beams emitted by the light-emitting diode chip. The light-concentrating unit is disposed between the light-emitting diode chip and the light-sensing device to concentrate the light beams emitted by the light-emitting diode chip.

15 Claims, 11 Drawing Sheets

DETECTION APPARATUS

CROSS-REFERENCE TO RELATED APPLICATION

This application claims the benefit of Taiwan Patent Application No. 101135674, filed on Sep. 27, 2012, in the Taiwan Intellectual Property Office, the disclosure of which is incorporated herein in its entirety by reference.

BACKGROUND OF THE INVENTION

1. Field of the Invention

The present invention generally relates to a detection apparatus, in particularly a detection apparatus for detecting luminous efficiency of light-emitting diode chips.

2. Description of the Related Art

Along with improvements in technology and upgrades in the quality of life, people living in modern society are much more focused on lighting. Whether it is the materials used in ancient times to create light by burning torches, animal or plant made oil lamps, candles, kerosene lamps and by electricity like white light and fluorescent light lamps or the light-emitting diode (LED) which is commonly used today, all of the devices mentioned above shows that lighting plays an extremely important role in the everyday life of humans.

Light-emitting diode emits a monochromatic light by combining different electronic holes to achieve the purposes of lighting or warning. Compared with traditional lighting sources, the light-emitting diode has many benefits including high luminous efficiency, long service life, difficult to break and fast reaction speed, etc. Due to vigorous promotion by governments in recent years and the rapid expansion of LED street lamps in various cities, LEDs used as a method for lighting can been seen everywhere.

Generally, a probe device is used to test the luminous efficiency of the light-emitting diode chips. The probe device provides the light-emitting voltage source for the light-emitting diode chips via the probe. Emitted light beams from the light-emitting diode chips pass through a chuck bearing this light-emitting diode chips, then are collected by a light-sensing device of the probe device, and then are used for determining the luminous efficiency of the light-emitting diode chips finally. However, the light beams emitted from the light-emitting diode chips may affect the accuracy of the light-emitting diode chips due to the detecting limit of the light-sensing device.

SUMMARY OF THE INVENTION

Based on the aforementioned problems in the prior art technique, one objective of the present invention is to provide a detection apparatus to solve the problem of poor light-collecting efficiency of the light-sensing device.

Another objective of the present invention is to provide a detection apparatus to collect the emitted light beams from the light-emitting diode chips.

The other objective of the present invention is to provide a detection apparatus to determine the luminous efficiency of the light-emitting diode chips accurately.

To achieve above objectives, the present invention provides a detection apparatus comprising a chuck, a probe device, a light-sensing device and a light-concentrating unit. The chuck bears light-emitting diode chips, and the probe device comprises two probes and a power supply. The two end points of the probes are electrically connected to one of the plurality of light-emitting diode chips and a power supply to make the light-emitting diode chip emit a plurality of the light beams. The light-sensing device is disposed on one side of a light-emitting surface of the light-emitting diode chip to receive the light beams emitted from the light-emitting diode chip. In addition, the light-concentrating unit is disposed between the light-emitting diode chip and the light-sensing device to concentrate the light beams emitted from the light-emitting diode chip. Furthermore, the light-concentrating unit and the chuck are interactive, and therefore another one of a plurality of light-emitting diode chips can be detected by moving the chuck. Wherein the chuck is composed of a material with light transmittance greater than 90%, and the light-sensing device could be an integral sphere, a solar panel, a phototransistor or a light dependent resistance.

In accordance with the first aspect of the present invention, the light-concentrating unit may be a light-concentrating film. More explicitly, the light-concentrating film is a diaphragm with a plurality of micro structures on its surface in order to collect the plurality of light beams passing through the light-concentrating film.

In accordance with the second aspect of the present invention, the light-concentrating unit may be a light-concentrating film. The light-concentrating film comprises the substrate with opposite upper and lower surfaces and a plurality of micro structures, and the plurality of micro structures are disposed on a lateral surface of the substrate close to the light-sensing device to collect the plurality of light beams passing through the light-concentrating film. Wherein the plurality of micro structures are not specifically limited to such following examples only: a plurality of prisms, a plurality of curved bars or a plurality of projections with curved surfaces. Said prisms mentioned above comprise the first inclined surface and the second inclined surface, and both of them form a vertex angle. Said zenith of the curved bar is an arc shape.

In accordance with the third aspect of the present invention, the light-concentrating unit may be a convergent lens.

In accordance with the fourth aspect of the present invention, the light-concentrating unit may be a lens assembly.

In accordance with the fifth aspect of the present invention, the light-concentrating unit may be a light guide element. The light guide element comprises a light-incident plane and a light-emitting plane. The area of light-emitting plane is smaller than that of the light-incident plane. The light-incident plane faces towards the light-emitting diode chips, and the light-emitting plane faces towards the light-sensing device.

In accordance with the sixth aspect of the present invention, the light-concentrating unit is a light guide element, and the light guide element comprises at least one optical fiber.

In accordance with the seventh aspect of the present invention, the light-concentrating unit is a multi-layer diaphragm with different refractive indexes.

In accordance with the above-mentioned, the detection apparatus of the present invention has one or several following advantages:

(1) The detection apparatus of the present invention can solve the problem of poor light-collecting efficiency on the light-sensing device by collecting the emitted light beams from the light-emitting diode chips via the light-concentrating unit.

(2) The detection apparatus of the present invention can increase the probability of the light beams passing through the light-concentrating unit and arriving at the light-sensing device by guiding the emitted light beams from the light-emitting diode chips via the light guide element.

(3) The detection apparatus of the present invention can attain the objective of accurately determining the luminous efficiency of the light-emitting diode chips.

DETAILED DESCRIPTION OF THE PREFERRED EMBODIMENTS

Figure 1:
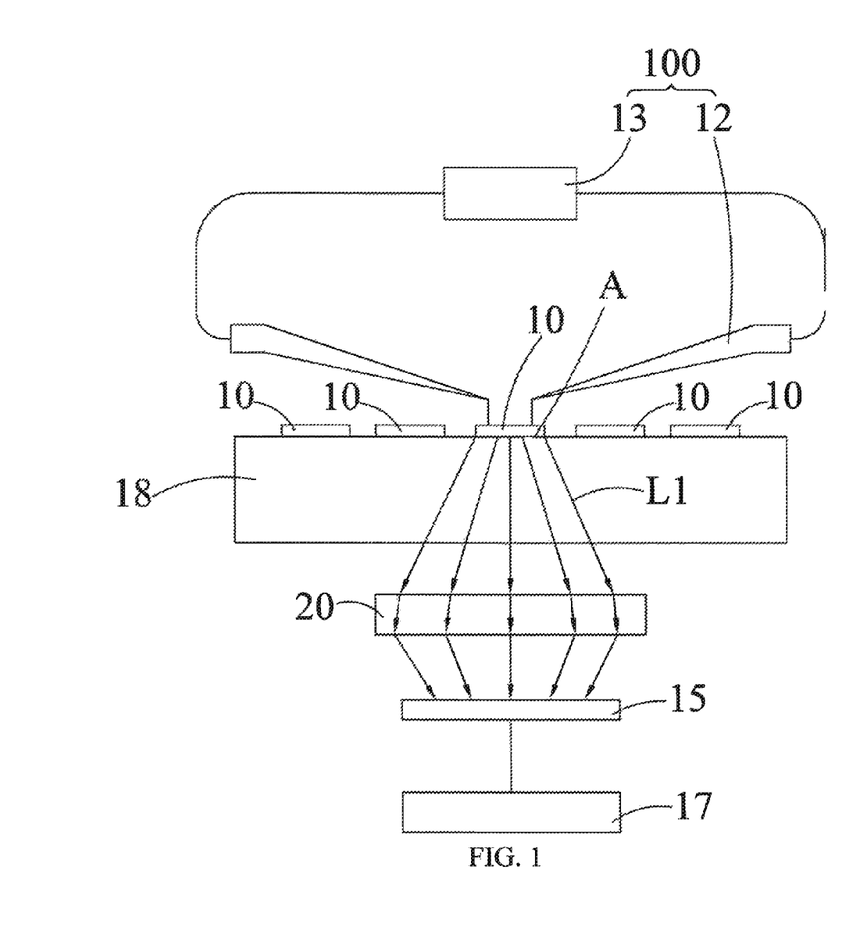
FIG. 1 is a schematic cross-sectional view of a first embodiment of a detection apparatus of the present invention.

With reference to FIG. 1 for a schematic cross-sectional view of a first embodiment of a detection apparatus in accordance with the present invention, the detection apparatus of the present invention comprises a chuck 18, a probe device 100, a light-sensing device 15 and a light-concentrating unit 20. The chuck 18 bears a plurality of light-emitting chips 10 to be detected, and the probe device 100 comprises two probes 12 and a power supply 13. The two end points of the probes 12 electrically connect to one of the plurality of light-emitting diode chips A and the power supply 13 to make the light-emitting diode chip A emit a plurality of the light beams L1. The light-sensing device 15 is disposed on one side of a light-emitting surface of the light-emitting diode chip A to receive the light beams L1 emitted from the light-emitting diode chip. In addition, the light-concentrating unit 20 is disposed between the light-emitting diode chip A and the light-sensing device 15 to concentrate the light beams L1 emitted from the light-emitting diode chip A. In addition, the light-concentrating unit 20 can selectively interact with the chuck 18. Thus, another one of the plurality of light-emitting diode chips can be detected by moving the chuck 18. Wherein the chuck 18 is composed of a material with light transmittance greater than 90%, and the light-sensing device 15 could be a integral sphere, a solar panel, a phototransistor or the light dependent resistance.

As shown in FIG. 1, the detection apparatus of the present invention is suitable to be used for determining the luminous efficiency of the light-emitting diode chips 10. The detection process is shown as follows: The power supply 13 of probe device 100 provides the voltage source for one of light-emitting diode chips A through the probe 12, causing the light-emitting diode chip A to emit a plurality of light beams L1. The plurality of light beams L1 emitted from the light-emitting diode chip A is incident to the chuck 18. The plurality of light beams L1 passes through the chuck 18 and is incident to the light-concentrating unit 20 which collects the plurality of light beams L1. Additionally, the light-sensing device 15 receives the plurality of light beams L1 collected by the light-concentrating unit 20, and the electronic device 17 electrically connected with the light-sensing device 15 shows the luminous efficiency of the light-emitting diode chip A.

Figure 2:
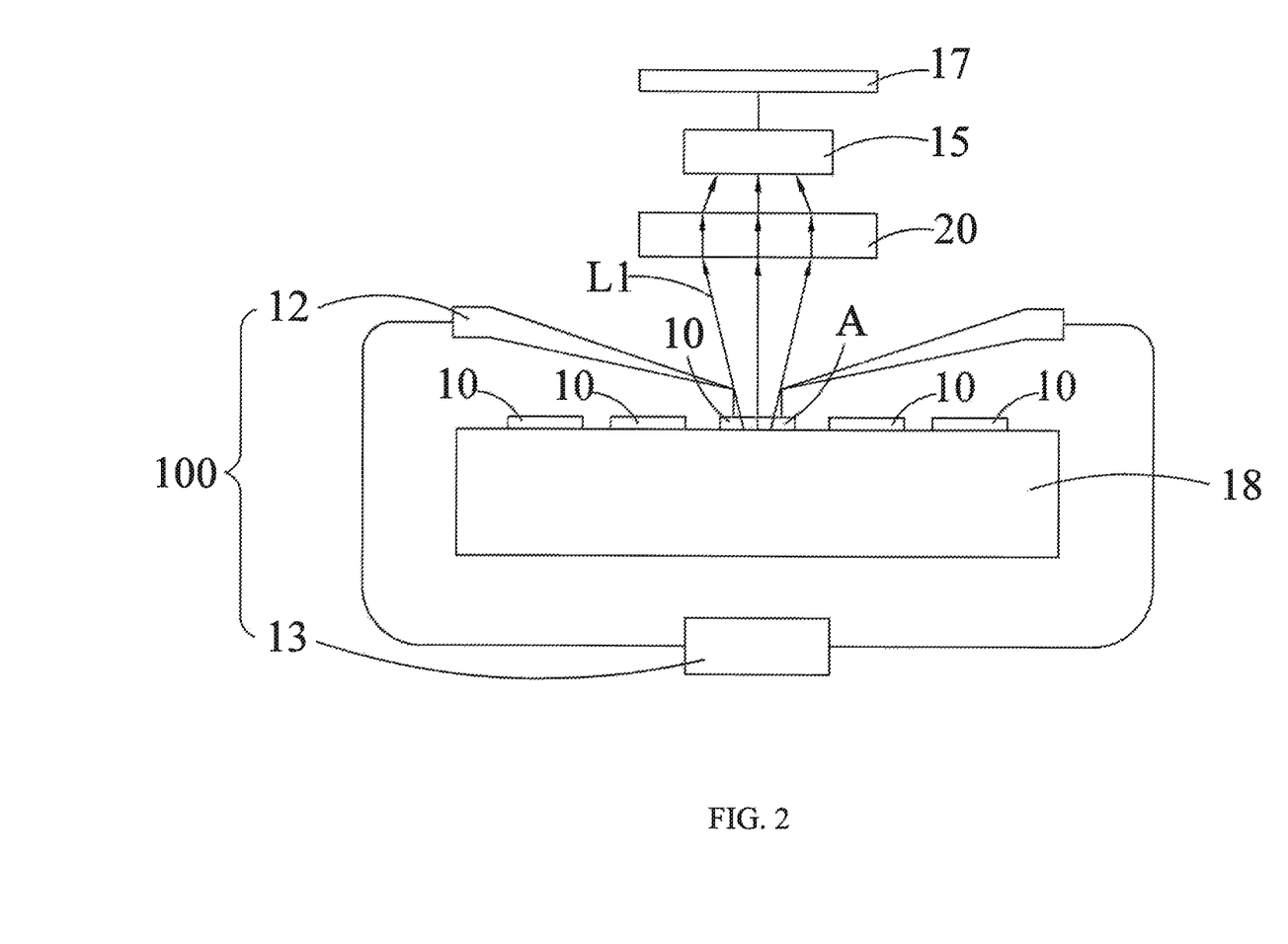
FIG. 2 is a schematic cross-sectional view of a second embodiment of the detection apparatus of the present invention.

With reference to FIG. 2 for a schematic cross-sectional view of a second embodiment of the detection apparatus in accordance with the present invention, the detection apparatus of the present invention comprises a chuck 18, a probe device 100, a light-sensing device 15 and a light-concentrating unit 20. The chuck 18 bears a plurality of light-emitting chips 10 which are waiting to be detected, and the probe device 100 comprises two probes 12 and a power supply 13. The two end points of the probes 12 electrically connect to one of the plurality of light-emitting diode chips A and the power supply 13 to make the light-emitting diode chip A emit a plurality of the light beams L1. The light-sensing device 15 is disposed on one side of a light-emitting surface of the light-emitting diode chip A to receive the light beams L1 emitted from the light-emitting diode chip. In addition, the light-concentrating unit 20 is disposed between the light-emitting diode chip A and the light-sensing device 15 to concentrate the light beams L1 emitted from the light-emitting diode chip A. In addition, the light-concentrating unit 20 is selectively interactive with the chuck 18. Thus, another one of the plurality of light-emitting diode chips can be detected by moving the chuck 18. Wherein the light-sensing device 15 could be, for example, an integral sphere, a solar panel, a phototransistor or a light dependent resistance.

As shown in FIGS. 1 and 2, the difference between the first and second embodiments is that, in the second embodiment, the plurality of light beams L1 emitted from the light-emitting diode chip do not pass through the chuck 18 but directly enter into the light-concentrating unit 20 in order for the light beams L1 to be collected. Therefore, the chuck 18 in the second embodiment of the present invention is not required to be composed of the material with high light transmittance.

As shown in FIG. 2, the detection apparatus of the present invention is suitable to be used for determining the luminous efficiency of the light-emitting diode chips 10. The detection process is as follows. The power supply 13 of the probe device 100 provides the voltage source for one of light-emitting diode chips A through the probe 12, causing the light-emitting diode chip A to emit a plurality of light beams L1. The plurality of light beams L1 emitted from the light-emitting diode chip A are incident to the light-concentrating unit 20. The plurality of light beams L1 are collected by the light-concentrating unit 20. Additionally, the light-sensing device 15 receives the plurality of light beams L1 collected by the light-concentrating unit 20, and the electronic device 17 electrically connected to the light-sensing device 15 shows the luminous efficiency of the light-emitting diode chip A.

Since the present invention collects the plurality of light beams emitted from the light-emitting diode chips by utilizing the light-concentrating unit. Several aspects of the light-concentrating unit are listed in order to further illustrate the form of the light-concentrating unit, but these aspects are not intended to limit the present invention. With reference to FIGS. 3A to 5B for schematic cross-sectional views of the first to the sixth embodiments of the light-concentrating unit in accordance with the present invention. While the means of specific embodiments in the present invention has been described, numerous modifications and variations could be made thereto by those skilled in the art without departing from the scope and spirit of the present invention. The modifications and variations should be the scope claimed by the present invention.

Figure 3A:
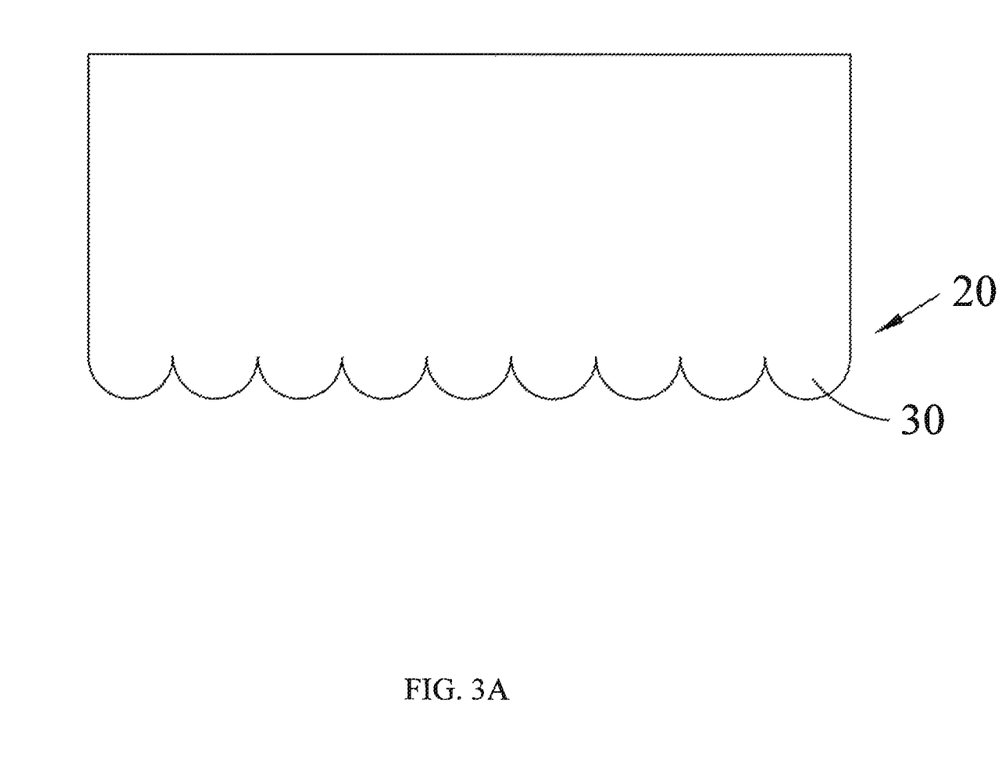
FIG. 3A is a schematic cross-sectional view of a first aspect of a light-concentrating unit of the present invention.

With reference to FIG. 3A for a schematic cross-sectional view of a first aspect of the light-concentrating unit in accordance with the present invention, the light-concentrating unit 20 of the present invention may be a light-concentrating film. The light-concentrating film is a diaphragm with multiple micro structures 30 on its surface. Within the first aspect of the light-concentrating unit of the present invention, the light-concentrating film is integrally made by such as embossing, or injection, etc.

Figure 3B:
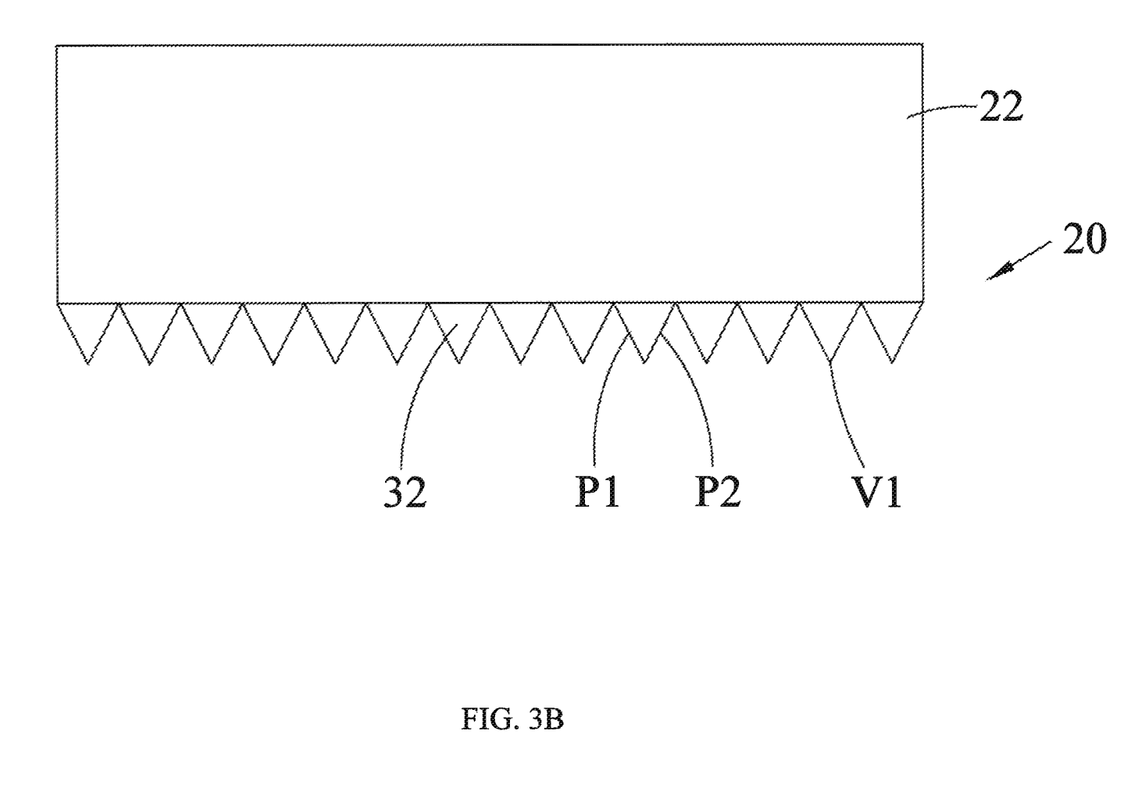
FIG. 3B-3D are schematic cross-sectional views of three examples in a second aspect of the light-concentrating unit of the present invention.
Figure 3C:
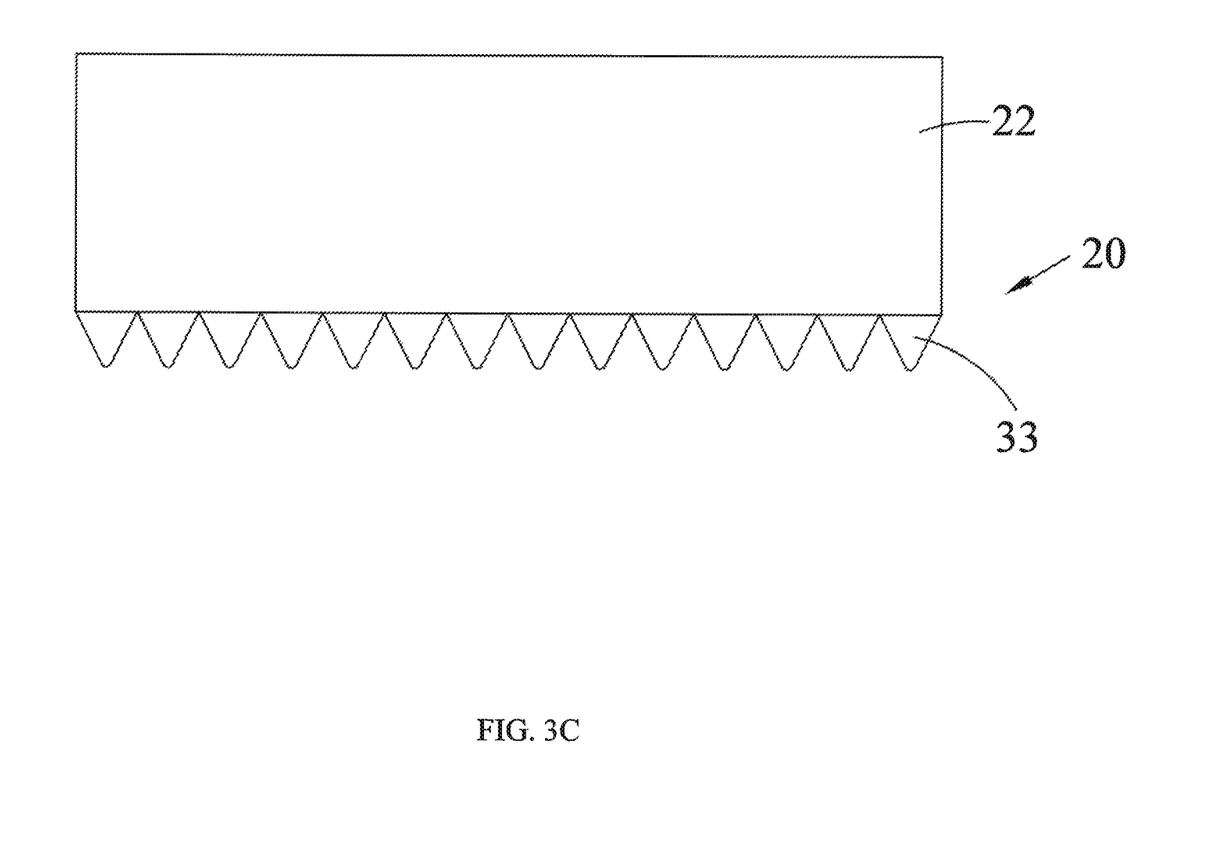
Figure 3D:
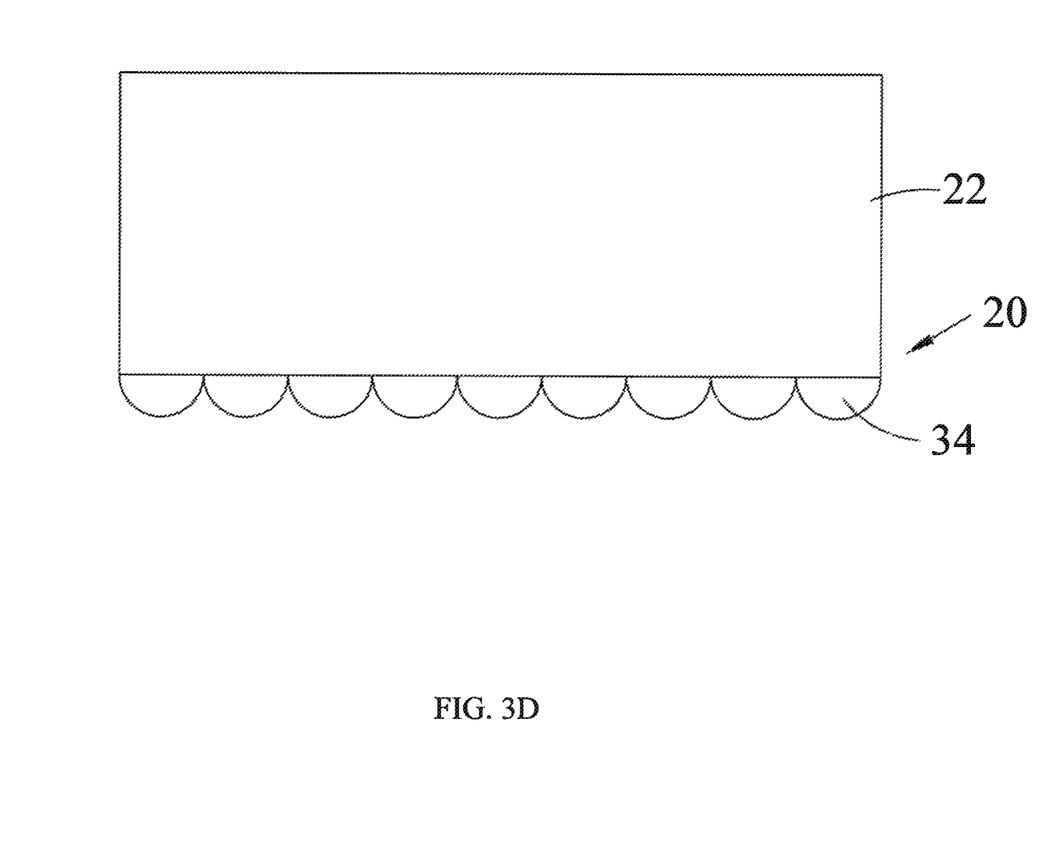

With reference to FIG. 3B to 3D for schematic cross-sectional views of three examples in a second aspect of the light-concentrating unit of the present invention, the light-concentrating unit 20 of the present invention may be a light-concentrating film. The light-concentrating film comprises the substrate 22 with opposite upper and lower surfaces as well as a plurality of micro structures, and the plurality of micro structures are disposed on one lateral surface of the substrate 22 close to the light-sensing device to collect a plurality of light beams passing through the light-concentrating film. Wherein the micro structures of the second aspect are prisms 32, curved prisms 33 or projections 34 with curved surfaces. With reference to FIG. 3B, said prisms 32 are disposed on a lateral surface of the substrate 22 (upper or lower surface). Each prism 32 comprises the first inclined surface P1 and the second inclined surface P2, and both P1 and P2 form a vertex angle. Because the objective of the prisms 32 of the second aspect is to collect the light beams entered into the light-concentrating unit 20. Whatever the angle that can make the prism 32 have vertex angle V1 with the function of collecting light beams would be within the scope of protection of the present invention. With reference to FIG. 3C, said curved prisms 33 are disposed on a lateral surface of the substrate 22 (upper or lower surface) and form the shape of curve on each zenith in order to collect the light beams incident to the light-concentrating unit 20. With reference to FIG. 3D, the projections 34 with curved surface are disposed on one lateral surface of the substrate 22 (upper or lower surface) in order to collect the light beams injected into the light-concentrating unit 20 by its curved surface. No specific limitation is set towards the arc in both the curved prisms 33 and the projections 34, any curved surface with the function to collect light beams is within the protection range of the present invention.

In addition, the manufacturing method of a micro structure for the second aspect of the light-concentrating unit in accordance with the preferred embodiment of the present invention may comprise the following processes applied for the light-emitting plane of the light-concentrating unit: coating process, dot printing, etching process, laser, chemical vapor deposition (CVD), etc. in order to form a regular or irregular coarse plane on the light-emitting plane of the light-concentrating unit. Furthermore, the material of micro structures could be, for example, polystyrene, silicon dioxide, poly acrylic, silicon oxide, silicon nitride, silicon oxynitride or fluorinated carbon.

Figure 4A:
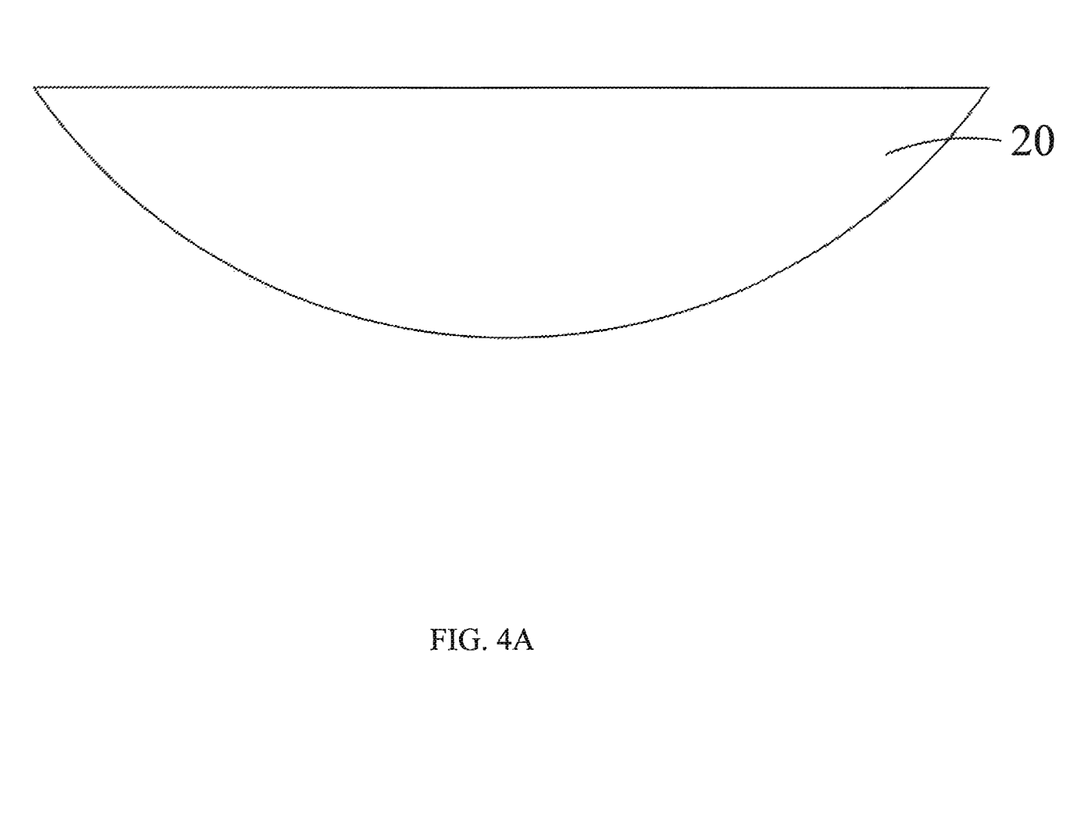
FIG. 4A is schematic cross-sectional view of a third aspect of the light-concentrating unit of the present invention.

With reference to FIG. 4A for a schematic cross-sectional view of a third aspect of the light-concentrating unit in accordance with the present invention, the light-concentrating unit 20 of the present invention may be exemplified like the convex lens.

Figure 4B:
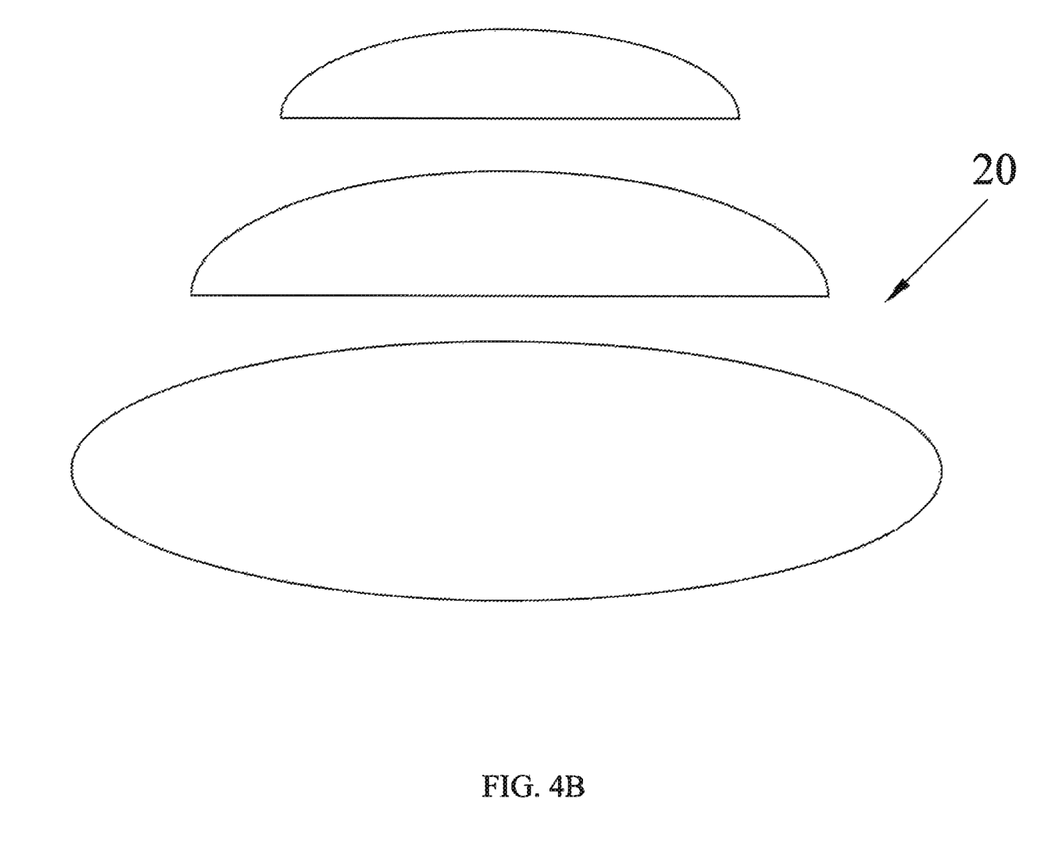
FIG. 4B is a schematic cross-sectional view of a fourth aspect of the light-concentrating unit of the present invention.

With reference to FIG. 4B for schematic cross-sectional view of a fourth aspect of the light-concentrating unit in accordance with the present invention, the light-concentrating unit 20 of the present invention may be exemplified such as a lens assembly. The number of transparent mirrors within the lens assembly is not limited to a specific number. As long as it enables the light-concentrating unit collect light beams, it should fall within the scope of protection of the present invention.

Figure 5A:
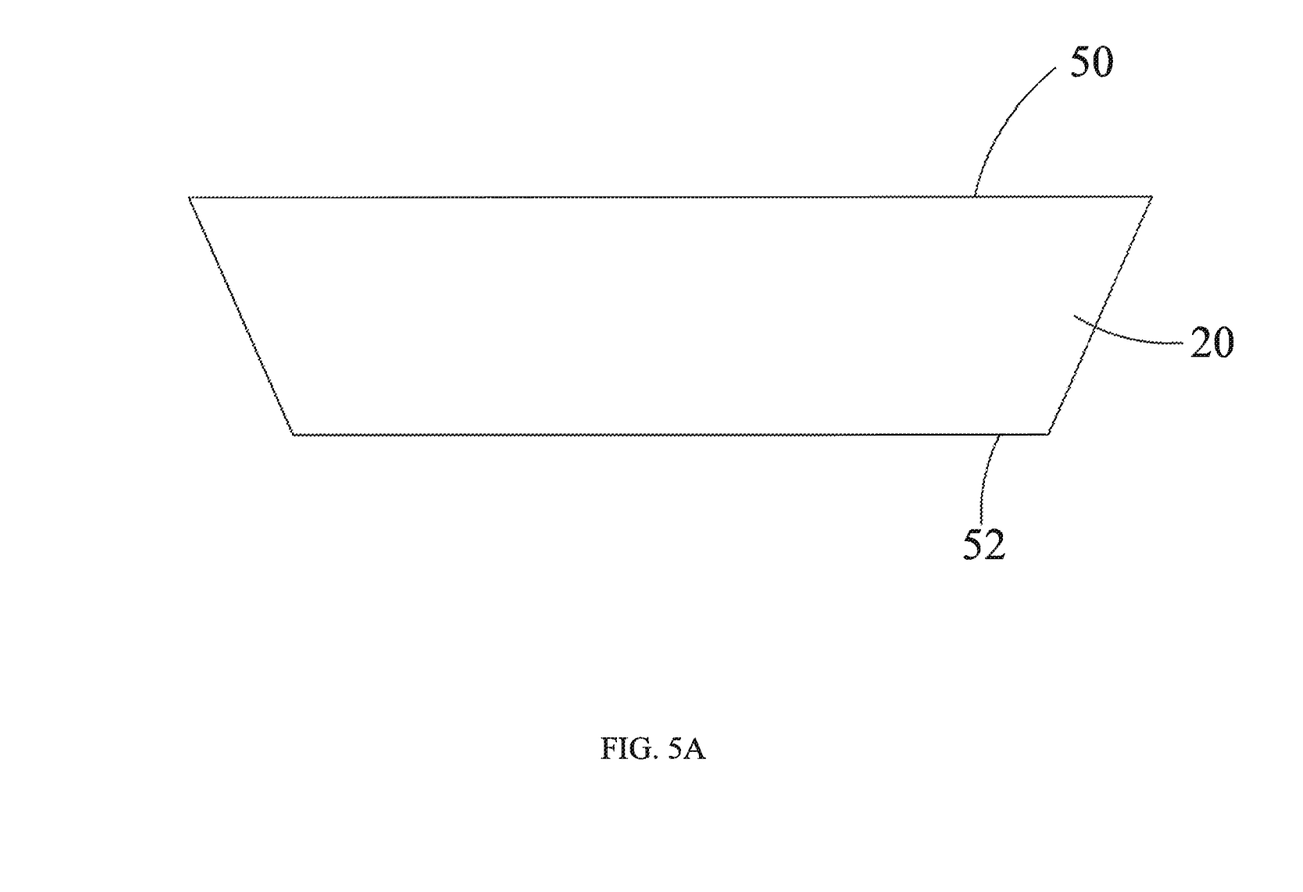
FIG. 5A is a schematic cross-sectional view of a fifth aspect of the light-concentrating unit of the present invention.

With reference to FIG. 5A for a schematic cross-sectional view of a fifth aspect of the light-concentrating unit in accordance with the present invention, the light-concentrating unit 20 of the present invention is may be light guide element. The light guide element comprises a light-incident plane 50 and a light-emitting plane 52. The area of light-emitting plane 52 is smaller than that of light-incident plane 50. The light-incident plane 50 faces towards the light-emitting diode chips, and the light-emitting plane 52 faces towards the light-sensing device. Additionally, surfaces with light-reflecting function are disposed on two sides of the light-concentrating unit 20 of the fifth aspect, and the light-injecting plane 50 is connected with the light-emitting plane 52 via the surface with light-reflecting function. While the light beams injecting into the light-concentrating unit 20 inject on the surface of two sides of said light-concentrating unit, they are reflected back to the inner part of light-concentrating unit 20 by the surface with light-reflecting function. Thus, the light beams are collected further.

Figure 5B:
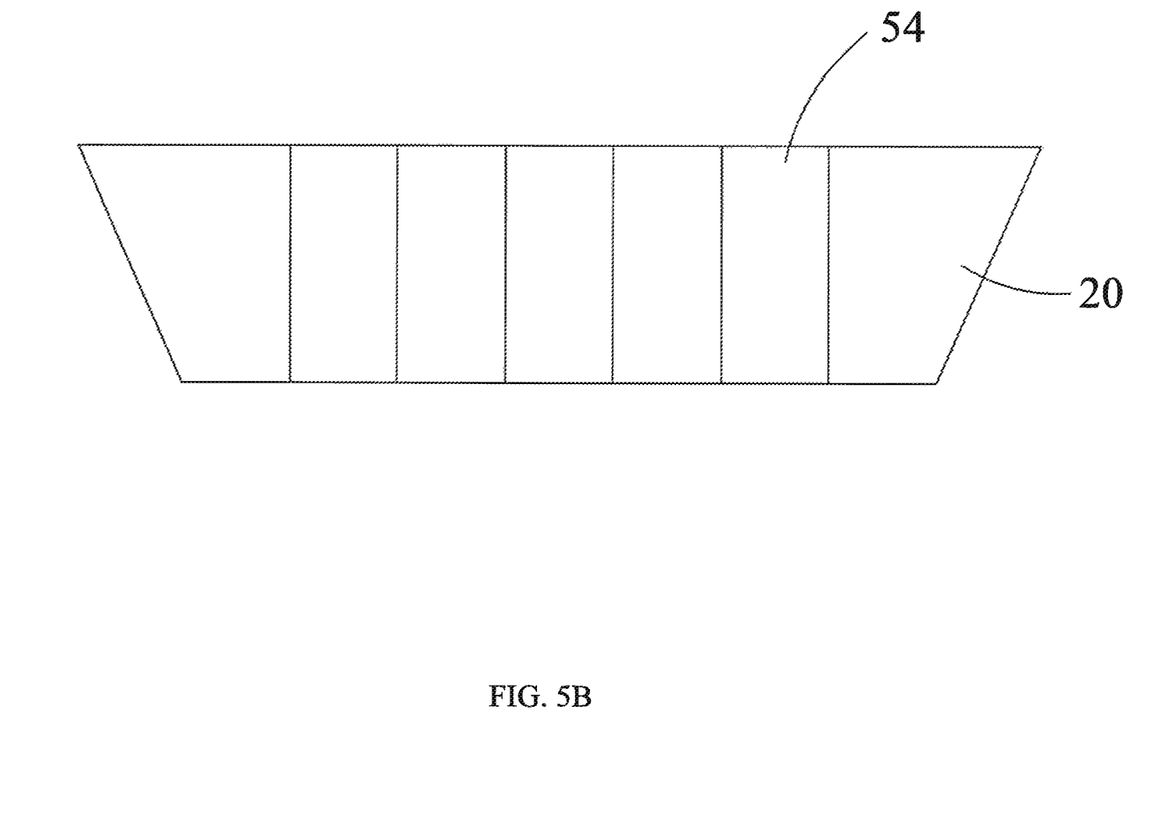
FIG. 5B is a schematic cross-sectional view of a sixth aspect of the light-concentrating unit of the present invention.

With reference to FIG. 5B for a schematic cross-sectional view of a sixth aspect of the light-concentrating unit in accordance with the present invention, the light-concentrating unit 20 of the present invention may be a light guide element, and the light guide element comprises at least one optical fiber 54 in order to guide a plurality of light beams to enter into the light-concentrating unit 20. However, the light guide element is not limited to be the optical fiber 54 showed in FIG. 5B. In other words, any light guide element having the function of guiding light beams is within the scope of protection of the present invention. Furthermore, via the disclosure of the present invention, persons skilled in the art are able to realize the type and size of the light-leading device with light guide function, and therefore, it is needless to describe further here.

Figure 6:
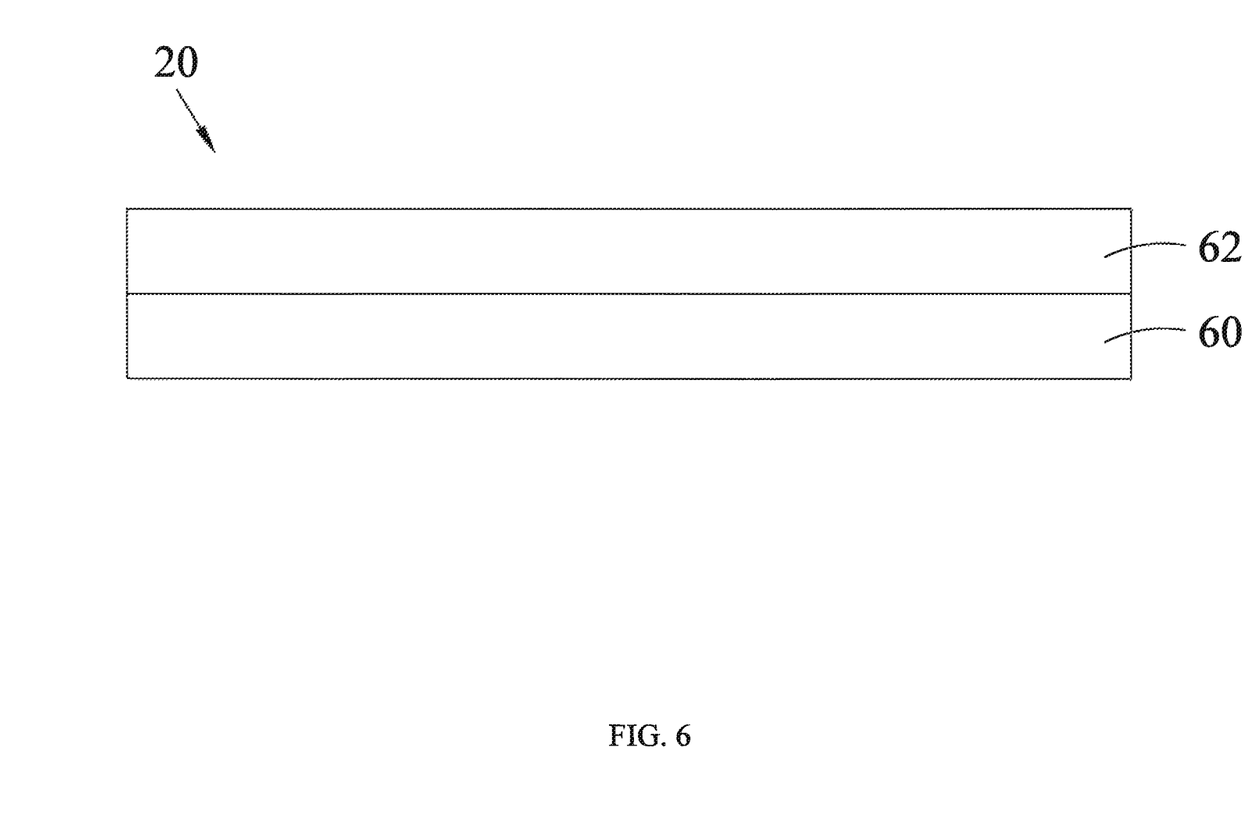
FIG. 6 is a schematic cross-sectional view of a seventh aspect of the light-concentrating unit of the present invention.

With reference to FIG. 6 for a schematic cross-sectional view of a seventh aspect of the light-concentrating unit in accordance with the present invention, the light-concentrating unit 20 of the present invention may be a multi-layer diaphragm with different refractive indexes (FIG. 6 roughly illustrates a two-layer membrane). The film layer with high refractive index 60 and that with low refractive index 62 are overlapping. The film layer with high refractive index 60 faces towards the light-sensing device to collect the light beams injecting into the light-concentrating unit 20 by increasing the refractive index. The production method of the multiple-layer diaphragm may be exemplified by electroplating or coating, etc. In addition, the light-concentrating unit 20 of the present invention is preferably a multi-layer diaphragm with gradually changing refractive indexes. Wherein the number of the film layer of the multi-layer diaphragm is not limited to a specific number. As long as it enables the light-concentrating unit to collect light beams, it should fall within the scope of protection of the present invention.

In summation of the description above, the detection apparatus of the present invention can collect the emitted light beams from the light-emitting diode chips via the light-concentrating unit, and enhance the efficiency for the collection of light beams on the light-sensing device, and then increasing the accuracy of detection apparatus to determine the luminous efficiency of the light-emitting diode chips.

While the means of specific embodiments in present invention has been described above, numerous modifications and variations could be made thereto by those skilled in the art without departing from the scope and spirit of the present invention. The modifications and variations should in a range limited by the specification of the present invention.

What is claimed is:

1. A detection apparatus, comprising:
   a chuck bearing a plurality of light-emitting diode chips to be detected;
   a probe device comprising two probes and a power supply, and two end points of each probe respectively electrically connected to one of the plurality of light-emitting diode chips and the power supply to make the light-emitting diode chip emit a plurality of light beams;
   a light-sensing device disposed on one side of a light-emitting surface of the light-emitting diode chip; and
   a light-concentrating unit disposed between the light-emitting diode chip and the light-sensing device, wherein the light-concentrating unit is a light-concentrating film.

2. The detection apparatus of claim 1, wherein the light-concentrating unit and the chuck are interactive.

3. The detection apparatus of claim 1, wherein the light-concentrating film is a diaphragm with a surface having a plurality of micro structures.

4. The detection apparatus of claim 1, wherein the light-concentrating film comprises a substrate and a plurality of micro structures, and the substrate has opposite upper and lower surfaces, and the micro structures are disposed on a lateral surface of the substrate close to the light-sensing device to collect the plurality of light beams passing through the light-concentrating film.

5. The detection apparatus of claim 4, wherein the micro structures are a plurality of prisms, and each prism includes a first inclined surface and a second inclined surface, and both of the first and second inclined surfaces form a vertex angle.

6. The detection apparatus of claim 4, wherein the micro structures are a plurality of curved bar.

7. The detection apparatus of claim 4, wherein the micro structures are a plurality of projections with curved surfaces.

8. A detection apparatus, comprising:
   a chuck bearing a plurality of light-emitting diode chips to be detected;
   a probe device comprising two probes and a power supply, and two end points of each probe respectively electrically connected to one of the plurality of light-emitting diode chips and the power supply to make the light-emitting diode chip emit a plurality of light beams;
   a light-sensing device disposed on one side of a light-emitting surface of the light-emitting diode chip; and
   a light-concentrating unit disposed between the light-emitting diode chip and the light-sensing device, wherein the light-concentrating unit is a light guide element which comprises a light-incident outer plane and a light-emitting outer plane, wherein an area of the light-emitting outer plane is smaller than that of the light-incident outer plane, wherein the light-incident outer plane faces towards the light-emitting diode chips, and the light-emitting outer plane faces towards the light-sensing device.

9. The detection apparatus of claim 8, wherein the light guide element comprises at least one optical fiber.

10. The detection apparatus of claim 1, wherein the light-concentrating film is a multiple-layer diaphragm with different refractive indexes.

11. The detection apparatus of claim 1, wherein the chuck is composed of a material with light transmittance greater than 90%.

12. The detection apparatus of claim 1, wherein the light-sensing device is an integral sphere, a solar panel, a phototransistor or a light dependent resistance.

13. The detection apparatus of claim 8, wherein the chuck is composed of a material with light transmittance greater than 90%.

14. The detection apparatus of claim 8, wherein the light-sensing device is an integral sphere, a solar panel, a phototransistor or a light dependent resistance.

15. The detection apparatus of claim 8, wherein the light-incident outer plane is connected with the light-emitting outer plane via a surface with light-reflecting function.

* * * * *